(12) United States Patent
Hirao et al.

(10) Patent No.: US 7,977,169 B2
(45) Date of Patent: Jul. 12, 2011

(54) SEMICONDUCTOR DEVICE INCLUDING ACTIVE LAYER MADE OF ZINC OXIDE WITH CONTROLLED ORIENTATIONS AND MANUFACTURING METHOD THEREOF

(75) Inventors: Takashi Hirao, Kochi (JP); Mamoru Furuta, Kochi (JP); Hiroshi Furuta, Kochi (JP); Tokiyoshi Matsuda, Kochi (JP); Takahiro Hiramatsu, Kochi (JP)

(73) Assignees: Kochi Industrial Promotion Center, Kochi-shi (JP); Casio Computer Co., Ltd., Tokyo (JP)

( * ) Notice: Subject to any disclaimer, the term of this patent is extended or adjusted under 35 U.S.C. 154(b) by 627 days.

(21) Appl. No.: 11/704,838

(22) Filed: Feb. 9, 2007

(65) Prior Publication Data

US 2007/0187678 A1 Aug. 16, 2007

(30) Foreign Application Priority Data

Feb. 15, 2006 (JP) ................... 2006-038424

(51) Int. Cl.
*H01L 21/00* (2006.01)
(52) U.S. Cl. ......... 438/150; 438/168; 438/187; 438/198
(58) Field of Classification Search ................... 438/150, 438/168, 187, 198
See application file for complete search history.

(56) References Cited

U.S. PATENT DOCUMENTS

| | | | |
|---|---|---|---|
| 6,727,522 B1 | 4/2004 | Kawasaki et al. | |
| 2004/0234823 A1 | 11/2004 | Burgener, II et al. | |

FOREIGN PATENT DOCUMENTS

JP 09-072783 A 3/1997

OTHER PUBLICATIONS

K.B. Sundaram and A. Khan, Characterization and optimization of zinc oxid films by r.f. magnetron sputtering, Thin Solid Flims 295 (1997) 87-91.*
W. Water et al., Li2Co3 doped ZnO films prepared by RF magnetron supttering technique for acoustic device application, Materials Letters 57 (2002) 998-1003.*
D.K. Murti, Substrate Biased Rf Sputtering of Zinc Oxide film, Applications of Surface Science, 11/12 (1982), 308-314.*
International Search Report dated May 31, 2007 (in English) issued in counterpart International Application No. PCT/JP2007/053119.
Korean Office Action dated Jul. 15, 2009 and English translation thereof, issued in counterpart Korean Application No. 10-2007-7020216.
Korean Office Action dated Jan. 6, 2010 and English translation thereof, issued in counterpart Korean Application No. 10-2007-7020216.

(Continued)

*Primary Examiner* — Marcos D. Pizarro
*Assistant Examiner* — Eva Y. Montalvo
(74) *Attorney, Agent, or Firm* — Holtz, Holtz, Goodman & Chick, PC

(57) ABSTRACT

A semiconductor device includes an oxide semiconductor thin film layer primarily including zinc oxide having at least one orientation other than (002) orientation. The zinc oxide may have a mixed orientation including (002) orientation and (101) orientation. Alternatively, the zinc oxide may have a mixed orientation including (100) orientation and (101) orientation.

12 Claims, 7 Drawing Sheets

OTHER PUBLICATIONS

Chinese Office Action dated Jun. 26, 2009 and English translation thereof, issued in counterpart Chinese Application No. 200780000102.1.

Chinese Office Action dated Dec. 4, 2009 and English translation thereof, issued in counterpart Chinese Application No. 200780000102.1.

Taiwanese Office Action dated Jan. 20, 2010 and English translation thereof, issued in counterpart Taiwanese Application No. 096105242.

Taiwanese Office Action dated May 31, 2010 and English translation thereof, issued in counterpart Taiwanese Application No. 096105242.

Sandeep Srivastav et al: "Effect of oxygen on the physical parameters of RF sputtered ZnO thin film"; Journal of Physics D. Applied Physics, Institute of Physics Publishing, Bristol, GB; vol. 22, No. 11; (Nov. 14, 1989) pp. 1768-1772, XP020014910; ISSN: 0022-3727.

Zhang D H et al: "Crystallite orientation and the related photoresponse of hexagonal ZnO films deposited by r.f. sputtering"; Thin Solid Films; Elsevier-Sequioia S.A. Lausanne, Ch; vol. 251, No. 2; (Nov. 1, 1994); pp. 151-156; XP004012281; ISSN: 0040-6090.

Weber A H et al: "Comparison of Rayleigh and Sezawa wave modes in ZnO-SiO2-Si structures"; Proceedings of the 1991 Ultrasonics Symposium; (Dec. 8, 1991); pp. 363-366; XP010093900.

Yong Eui Lee et al: "Microstructural Evolution and Preferred Orientation Change of Radio-Frequency-Magnetron Sputtered ZnO Thin Films"; Journal of Vacuum Science and Technology A. Vacuum, Surfaces and Films, American Institute of Physics, New York, NY, US; vol. 14, No. 3; (May 1996); pp. 1943-1948; XP 009051928; ISSN: 0734-2101.

Lee J. B. et al: "Effects of surface roughness of substrates on the c-axis preferred orientation of ZnO films deposited by r.f. magnetron sputtering"; Prepartion and Characterization, Elsevier Sequoia, NL; vol. 423, No. 2; (Jan. 15, 2003); pp. 262-266; XP004404511; ISSN: 0040-6090.

* cited by examiner

BIAS 0W

500A

BIAS 5W

500A

SEMICONDUCTOR DEVICE INCLUDING ACTIVE LAYER MADE OF ZINC OXIDE WITH CONTROLLED ORIENTATIONS AND MANUFACTURING METHOD THEREOF

CROSS-REFERENCE TO RELATED APPLICATIONS

This application is based upon and claims the benefit of priority from the prior Japanese Patent Application No. 2006-38424, filed on Feb. 15, 2006, the entire contents of which are incorporated herein by reference.

BACKGROUND OF THE INVENTION

1. Field of Invention

The present invention relates to a semiconductor device including an oxide semiconductor thin film layer primarily comprising zinc oxide with controlled orientations and a manufacturing method thereof.

2. Description of the Background Art

It has been known for many years that oxides such as zinc oxide or magnesium zinc oxide have excellent characteristics as a semiconductor (an active layer). In recent years, active research and development of a semiconductor thin film layer using these compounds have been made in order to apply such a semiconductor thin film layer to electronic devices such as a thin film transistor (hereinafter abbreviated as TFT), a light emitting device, and a transparent conductive film.

An oxide TFT including a semiconductor thin film layer made of zinc oxide or magnesium zinc oxide has greater electron mobility and better TFT characteristics than an amorphous silicon TFT having a semiconductor thin film layer of amorphous silicon (a-Si:H), which has been mainly used for liquid crystal displays. Another advantage of the oxide TFTs is that high electron mobility can be expected because a crystalline thin film is formed even at a temperature as low as a room temperature. These advantages have been encouraging the development of the oxide TFTs.

TFTs using an oxide semiconductor thin film layer, such as a bottom gate type TFT and a top gate type TFT, have been reported.

The bottom gate type TFT includes, for example, a substrate, a gate electrode formed on the substrate, a gate insulating film formed on the gate electrode, an oxide semiconductor thin film layer primarily comprising zinc oxide and disposed on the upper surface of the gate electrode, a pair of source/drain electrodes connected to the oxide semiconductor thin film layer. The bottom gate type oxide TFTs are manufactured in a similar process to bottom gate type amorphous silicon TFTs, a manufacturing process of which has been already industrialized. Such bottom-gate type configuration is widely used in zinc oxide TFTs.

On the other hand, the top gate type TFT includes, for example, a substrate, a pair of source/drain electrodes formed on the substrate, an oxide semiconductor thin film layer formed on the source/drain electrodes, a gate insulating film formed on the oxide semiconductor thin film layer, and a gate electrode formed on the gate insulating film.

In the bottom gate type TFTs, the oxide semiconductor thin film layer is formed on the gate insulating film. In the bottom gate type TFTs with such a structure, an insufficiently crystallized area of the oxide semiconductor thin film layer, which is deposited at an early stage of the oxide semiconductor thin film layer formation, inevitably functions as an active layer. This results in insufficient electron mobility. In the top gate type TFTs, on the other hand, the gate insulating film is provided on the oxide semiconductor thin film layer. This means the sufficiently crystallized area in the upper part of the oxide semiconductor thin film layer functions as an active layer. In this respect, the top gate type TFTs are more useful than the bottom gate type TFTs.

Conventionally, zinc oxide semiconductor thin film layers with high c-axis crystal orientation have been preferably used. In such zinc oxide semiconductor thin film layers, crystal grains have c-axes that are aligned in a direction perpendicular to the substrate. Use of a zinc oxide semiconductor thin film layer with preferred orientation in a certain direction is considered to increase the electron mobility of the thin film transistor (TFT) that includes the zinc oxide semiconductor thin film layer. It is known that a zinc-oxide-based film with high c-axis crystal orientation can be formed by means of sputtering at a temperature of 500 degrees C. or lower. However, no reports have been made about orientation control aiming at other orientations than c-axis orientation or about amorphous zinc oxide.

On the other hand, various research has been performed with respect to increasing c-axis orientation of the semiconductor thin film layer of TFTs. Also, a method of increasing the c-axis orientation of the pyroelectric part of thin film pyroelectric infrared detection elements is disclosed in Japanese Patent No. 2787198.

Zinc oxide with high c-axis orientation includes columnar structures extending along the film thickness direction, and many grain boundaries exist in the zinc oxide. In the grain boundaries, there exist lattice defects, crystal distortion, and dangling bonds. Therefore the oxide semiconductor thin film layer is thermally unstable. When the oxide semiconductor thin film layer undergoes heat treatment for certain purposes (e.g. formation of a gate insulating film), desorption of oxide and zinc occurs in the grain boundaries of the oxide semiconductor thin film layer. This results in defect levels that produce electrically shallow impurity levels and decrease the resistance of the oxide semiconductor thin film layer. If such an oxide semiconductor thin film layer is used as an active layer in a thin film transistor, the thin film transistor operates in a normally-on mode (depression mode). In other words, drain current occurs without applying gate voltage. In the depression mode operation, defect levels increase while threshold voltage decreases and the leak current increases. In addition, the grain boundaries serve as an energy barrier against electrons in the channel and decrease the electron mobility.

Such problems are more prominent in the top gate thin film transistors, in which the gate insulating film is deposited on the oxide semiconductor thin film layer, than in the bottom gate type thin film transistors.

In the oxide semiconductor thin film layer primarily comprising zinc oxide with high c-axis orientation that has columnar structures, etching occurs along the columnar structures. Such etching causes difficulties in microfabrication. The columnar structures increase roughness of the oxide semiconductor thin film layer surface and the increased roughness prevents the formation of a thin gate insulating film disposed thereon. It further causes breakdown of the gate insulating film due to an electric field concentration and increased leakage current of the gate insulating film.

As described above, the oxide semiconductor thin film layer with high c-axis orientation has defects in heat resistance, a microfabrication property (material property to facilitate microfabrication), and surface smoothness when used in thin film transistors as well as other semiconductor devices such as diodes and photoelectric conversion elements.

SUMMARY OF INVENTION

Considering the above-described problems, one object of the present invention is to provide a semiconductor device including an oxide semiconductor thin film layer with an improved heat resistance, microfabrication property, and surface smoothness, as a constituent semiconductor.

The semiconductor device of the present invention includes an oxide semiconductor thin film layer primarily comprising zinc oxide. The orientations of zinc oxide contained in the oxide semiconductor thin film layer include at least one orientation other than (002) orientation.

The manufacturing method of the semiconductor device according to the present invention includes forming an oxide semiconductor thin film layer on a substrate, using an oxide target primarily comprising zinc oxide. During the formation of the oxide semiconductor thin film layer, radio-frequency electric power is applied to the substrate to control the orientations of the zinc oxide contained in the oxide semiconductor thin film layer from (002) orientation.

BRIEF DESCRIPTION OF THE DRAWINGS

Further features and advantages of the present invention will become apparent from the following detailed description, taken in combination with the accompanying drawings.

FIG. 2A is a cross sectional view of the thin film transistor after forming a pair of source/drain electrodes on the substrate; FIG. 2B is a cross sectional view of the thin film transistor after coating the oxide semiconductor thin film layer; FIG. 2C is a cross sectional view of the thin film transistor after forming the first gate insulating film; FIG. 2D is a cross sectional view of the thin film transistor after coating and patterning the photoresist; FIG. 2E is a cross sectional view of the thin film transistor after patterning the oxide semiconductor thin film and the first gate insulating film; FIG. 2F is a cross sectional view of the thin film transistor after forming the second gate insulating film and the contact hole; and FIG. 2G is a cross sectional view of the thin film transistor after forming the gate electrode, the contact part, external source/drain electrodes, and the display electrode;

DETAILED DESCRIPTION

A thin film transistor according to the present invention will be described below as an example of a semiconductor device according to the present invention. The semiconductor device of the present invention is not limited to a thin film transistor but may be another semiconductor element, such as a diode or a photoelectric conversion element such as a sensor. Although the thin film transistor as shown in the following embodiments has a top-gate structure, the thin film transistor of the present invention may be a bottom-gate type TFT or a TFT having other top-gate structures.

In the following description, orientations of zinc oxide are represented by the Miller indices, such as (002), (100), and (101). These Miller indices correspond to the following indices for the hexagonal crystal system.

TABLE 1

| Miller Indices | Indices for hexagonal crystal system |
| --- | --- |
| (002) orientation | (0002) orientation |
| (100) orientation | (10$\bar{1}$0) orientation |
| (101) orientation | (10$\bar{1}$1) orientation |

Figure 1:
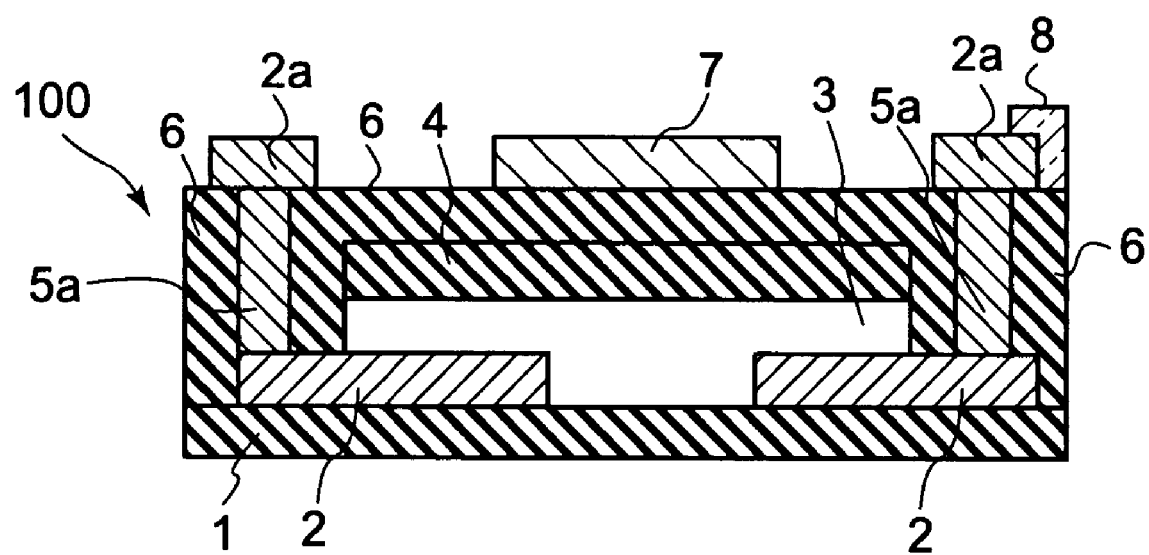
FIG. 1 is a cross-sectional view of the thin film transistor (TFT) according to one embodiment of the present invention. The thin film transistor is an example of a semiconductor device according to the present invention.

The thin film transistor 100 of the present invention includes a substrate 1, a pair of source/drain electrodes 2, an oxide semiconductor thin film layer 3, a first gate insulating film 4, contact parts 5a, a pair of external source/drain electrodes 2a, a second gate insulating film 6, a gate electrode 7, a display electrode 8, which are formed in the order shown in FIG. 1.

The thin film transistor 100, as shown in FIG. 1a, is formed on the substrate 1, which is made of glass (non-alkali glass primarily comprising $SiO_2$ and $Al_2O_3$). The material forming the substrate 1 is not limited to glass, and other insulating materials, such as plastics covered with an insulator and metal foils covered with an insulator, may be used to form the substrate 1.

The pair of source/drain electrodes 2 is formed on the upper surface of the substrate 1. The pair of the source/drain electrodes 2 includes a source electrode and a drain electrode that are spaced apart from each other.

The source/drain electrodes 2 are made of conductive oxides such as indium tin oxide (ITO) and n+ZnO; or metal; or metal at least partially covered with the conductive oxides.

The oxide semiconductor thin film layer 3 is formed on the substrate 1 and on the pair of the source/drain electrodes 2. The oxide semiconductor thin film layer 3 is arranged to form a channel between the pair of the source/drain electrodes 2. The oxide semiconductor thin film layer 3 is made of oxide semiconductor primarily comprising zinc oxide. As used herein, an oxide semiconductor primarily comprising zinc oxide includes, for example, but is not limited to: intrinsic (non-doped) zinc oxide; zinc oxide doped with a p-type dopant such as Li, Na, N, C; zinc oxide doped with an n-type dopant such as B, Al, Ga, In; and zinc oxide doped with Mg, Be.

An oxide semiconductor thin film layer 3 including zinc oxide with at least one orientation other than (002) orientation may be used to obtain a smoother surface, a better microfabrication property, and higher heat resistance than a conventional oxide semiconductor thin film layer.

In another embodiment, an oxide semiconductor thin film layer 3 containing zinc oxide having a mixed orientation including (002) orientation and (101) orientation may be used. In this embodiment, the ratio I(002)/I(101) between X-ray diffraction intensity I(002) indicating the (002) orientation and X-ray diffraction intensity I(101) indicating the (101) orientation is preferably 2 or less. Since such an oxide semiconductor thin film layer has a smoother surface than a conventional oxide semiconductor film, it is possible to form a thinner gate insulating film, which enhances the gate capacitance and current drive ability of the thin film transistor. Also, since the zinc oxide is in a microcrystalline state or in an amorphous state, the oxide semiconductor thin film layer has a better microfabrication property and higher heat resistance.

In yet another embodiment, an oxide semiconductor thin film layer 3 containing zinc oxide having a mixed orientation including (100) orientation and (101) orientation may be used. In this embodiment, the ratio I(101)/I(100) between X-ray diffraction intensity I(101) indicating the (101) orientation and X-ray diffraction intensity I(100) indicating the (100) orientation is preferably in the range from 0.5 to 5. Zinc oxide having a (100) and (101) mixed orientation has higher heat resistance and prevents a decrease in the resistance of the oxide semiconductor thin film layer resulting from desorption of constituents of zinc oxide during heat treatment in the manufacturing process. Therefore, leak current is suppressed. Also, a microfabrication property of the zinc oxide is improved.

The thickness of the oxide semiconductor thin film layer 3 is not particularly limited but may be, for example, about 25-200 nm and preferably about 30-100 nm.

The first gate insulating film 4 is formed to cover only the upper surface of the oxide semiconductor thin film layer 3. The first gate insulating film 4 constitutes a part of the gate insulating film and serves as a protection film to protect the oxide semiconductor thin film layer 3 from resist stripper used in the photolithography process. The thickness of the first gate insulating film 4 is not particularly limited but may be, for example, 20-100 nm, and preferably about 50 nm or less.

The second gate insulating film 6 is formed on a pair of the source/drain electrodes to cover the side surfaces of the oxide semiconductor thin film layer 3 and the entire surface of the first gate insulating film 4. Since the upper surface of the oxide semiconductor thin film layer 3 is covered with the first gate insulating film 4, coverage on the entire surface of the oxide semiconductor thin film layer 3 is then completed.

The thickness of the second gate insulating film 6 may be, for example, 200-400 nm and preferably about 300 nm.

The first gate insulating film 4 and the second gate insulating film 6 may be a silicon oxide (SiOx) film, a silicon oxide nitride (SiON) film, a silicon nitride (SiNx) film, or a silicon nitride (SiNx) film doped with oxygen using oxygen or a compound containing oxygen. Preferably, the gate insulating film 4 is formed with a silicon nitride (SiNx) film doped with oxygen using oxygen or compound (e.g. $N_2O$) containing oxygen. Such a doped silicon nitride film has a higher dielectric constant than silicon oxide compound (SiOx) or silicon oxide nitride (SiON).

The first gate insulating film 4 and the second gate insulating film 6 are formed, for example, by means of plasma-enhanced chemical vapor deposition (PCVD). The film formation by plasma-enhanced chemical vapor deposition (PCVD) is preferably carried out at a substrate temperature in the range of 200-400 degrees C.

The external source/drain electrodes 2a are respectively connected to the corresponding source/drain electrodes 2 via the contact parts 5a.

The gate electrode 7 is formed on the second gate insulating film 6. The gate electrode 7 is configured to control the electron density in the oxide semiconductor thin film layer 3 according to the gate voltage applied to the thin film transistor. The gate electrode 7 is made of a metal film such as a Cr film or a Ti film.

The display electrode 8 is configured to apply a voltage to liquid crystal used in a liquid crystal display. The display electrode 8 is formed by a conductive oxide thin film such as an indium tin oxide (ITO) thin film and the like because it must have high transmittance with respect to visible light. The display electrode 8 is formed on the second gate insulating film 6 and extends in a different direction from the gate electrode 7.

Referring to FIGS. 2A-2G, the manufacturing method of the thin film transistor according to one embodiment of the present invention will be described below.

Figure 2A:
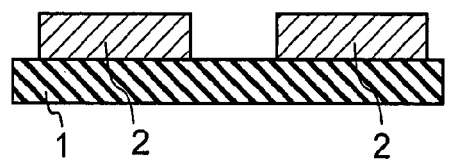
FIGS. 2A to 2G are cross-sectional views of the thin film transistor (TFT) sequentially showing one embodiment of the manufacturing method of the thin film transistor according to the present invention.

Referring to FIG. 2A, a thin metal film such as a Cr film or a Ti film is formed on the glass substrate 1 by means of magnetron sputtering to have a thickness of, for example, 50 nm. The thin film is then patterned into a pair of the source/drain electrodes 2 by means of photolithography.

Figure 2B:
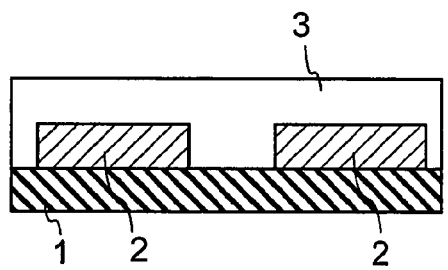

Referring to FIG. 2B, the oxide semiconductor thin film layer 3 is formed on the entire upper surface of the pair of the source/drain electrodes 2 and on the glass substrate 1 by means of magnetron sputtering to have a thickness of 30-100 nm. The oxide semiconductor thin film layer 3 may be a zinc-oxide-based semiconductor thin film or preferably an intrinsic-zinc-oxide (ZnO)-based semiconductor thin film.

It is known that zinc-oxide-based oxide semiconductor thin films formed by means of common magnetron sputtering have a preferred (002) orientation. In other words, the zinc-oxide-based oxide film has no X-ray diffraction peaks indicating other orientations than (002) orientation. In the present invention, on the other hand, the orientations of the oxide semiconductor thin film layer are controlled by applying radio frequency electric power to the substrate via a substrate stage (a stage on which the substrate is laid on during the film formation) during the film formation by magnetron sputtering. Specifically, an appropriate power (see below) of radio frequency (13.56 MHz in the present embodiment) bias electric power is applied to the substrate whereas 180 W of radio frequency (13.56 MHz in the present embodiment) input electric power is applied to the oxide target.

About 1-10 W, preferably about 1-5 W, of the bias electric power enables the ratio I(002)/I(101) of the oxide semiconductor thin film layer to be 2 or less. Since such an oxide semiconductor thin film layer has a smoother surface than a conventional oxide semiconductor thin film, it is possible to form a thinner gate insulating film, which enhances the current drive ability of the thin film transistor. Also, since the zinc oxide is in a microcrystalline state or in an amorphous state, the oxide semiconductor thin film layer has an improved microfabrication property and higher heat resistance. Less than 1 W of bias electric power may also be used as long as it has the above-mentioned effects.

10 W or more bias electric power may be applied to the substrate during deposition of the oxide semiconductor thin film layer. If the bias electric power exceeds 10 W (i.e. 5% of the input electric power), the orientation of the oxide semiconductor thin film layer changes to (100) and (101) mixed orientation from (002) and (101) mixed orientation (which is achieved while the bias electric power is below 5% of the input electric power). In other words, the oxide semiconductor thin film layer having the I(101)/I(100) ratio ranging from 0.5 to 5 is obtained by setting the bias electric power above 5% of the input electric power. Zinc oxide with the (100) and (101) mixed orientation has higher heat resistance and prevents a decrease in the resistance of the oxide semiconductor thin film layer resulting from desorption of constituents of zinc oxide during heat treatment in the manufacturing process. Therefore, leak current is suppressed. Also a microfabrication property of the zinc oxide is improved. The method of controlling the orientations of zinc oxide by applying the above-mentioned bias electric power will be described in the examples shown below referring to FIG. 3.

In some embodiments, the orientations of zinc oxide may be controlled by changing other film formation conditions than the amount of bias electric power applied. Also the boundary between the ratio of the input electric power and the bias electric power at which a mixed orientation of (101) and (102) changes to a mixed orientation of (100) and (101) may vary depending on the conditions used. The above-mentioned value of 5% is a value under the conditions engaged in the examples described below. The value may vary according to the apparatus used and to the frequency of the bias electric power.

Figure 2C:
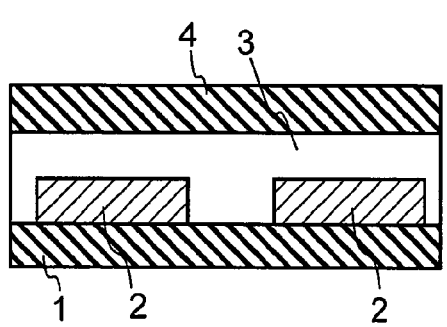

Referring to FIG. 2C, the first gate insulating film 4 is formed on the oxide semiconductor thin film layer 3 using a technique and under a condition(s) that do not reduce the resistance of the oxide semiconductor thin film layer 3.

The gate insulating film 4 may be a 20 to 50 nm thick SiNx film created by means of plasma-enhanced chemical vapor deposition (PCVD) under a condition, for example, where a substrate temperature is 250° C. and mixed gas containing $NH_3$ and $SiH_4$ is used at a flow rate ratio of 4 to 1.

Figure 2D:
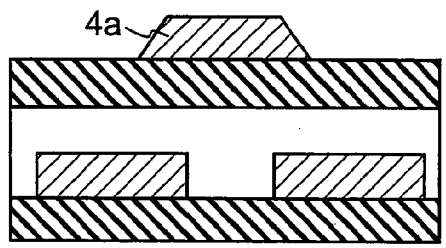

Referring to FIG. 2D, photoresist is disposed and patterned on the first gate insulating film 4. Using the patterned photoresist 4a as a mask, the first gate insulating film 4 is dry-etched with a gas such as $SF_6$. Then the oxide semiconductor thin film layer 3 is wet-etched with 0.2% $NHO_3$.

Figure 2E:
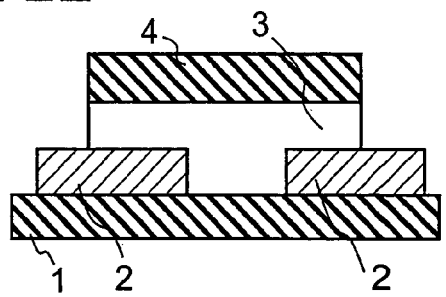

FIG. 2E shows a cross section of the thin film transistor after removing photoresist 4a following the wet-etching of the oxide semiconductor thin film layer 3. In the thin film transistor shown in FIG. 2E, a TFT active layer region including the first gate insulating film 4 with an identical shape to the oxide semiconductor thin film layer 3 is formed. The first gate insulating film 4 not only forms an interface with the oxide semiconductor thin film layer 3 but also protects the oxide semiconductor thin film layer 3 while an active region is patterned. If the first gate insulating film 4 is not present, while the resist stripper is used to remove photoresist 4a after the patterning of an active region of the TFT, the resist stripper contacts with the surface of the oxide semiconductor thin film layer 3. The resist stripper generally etches and roughens the surface and crystal grain boundaries of the oxide semiconductor thin film layer 3. However, if the first gate insulating film 4 is present on the surface of the oxide semiconductor thin film layer 3, the first gate insulating film 4 functions as a protective film against various kinds of liquid chemicals such as a resist stripper used in a photo-lithography process. The first gate insulating film 4 therefore prevents the surface of the oxide semiconductor thin film layer 3 from roughening.

Figure 2F:
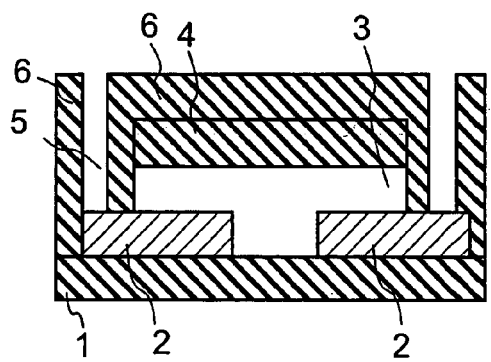

Referring to FIG. 2F, after the TFT active layer region is patterned, the second gate insulating film 6 is formed on the entire upper surfaces and/or side surfaces of the substrate 1, the pair of the source/drain electrodes 2, the oxide semiconductor thin film layer 3, and the first gate insulating film 4. Then contact holes are opened in the second gate insulating film 6 to expose portions of the pair of the source/drain electrodes 2. In this embodiment, it is desirable to form the second gate insulating film 6 under similar conditions to the first gate insulating film 4 (interface controlled insulating film).

Figure 2G:
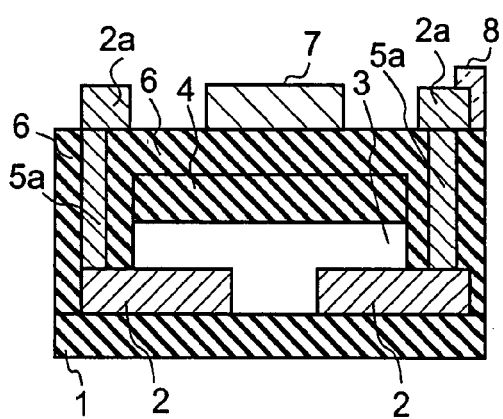

Finally, referring to FIG. 2G, the gate electrode 7 made of a metal film (e.g. a Cr film or a Ti film) is formed on the second gate insulating film 6. After that, external source/drain electrodes 2a are formed with the same material as the gate electrode 7. The external source/drain electrodes are respectively connected to the source/drain electrodes 2 via contact parts 5a. In the final step to form a TFT array, a display electrode 8 made of, for example, indium tin oxide (ITO) is formed.

EXAMPLES

Hereinafter, the experimental examples for evaluating the oxide semiconductor thin film layer of the semiconductor device according to the present invention will be shown, to clarify the effects of the present invention. The oxide semiconductor thin film layer used in the examples below was formed by means of magnetron sputtering while applying a constant 180 W of input electric power having a frequency of 13.56 MHz to the target and applying various bias electric powers having a frequency of 13.56 MHz to the substrate via a substrate stage.

Figure 3:
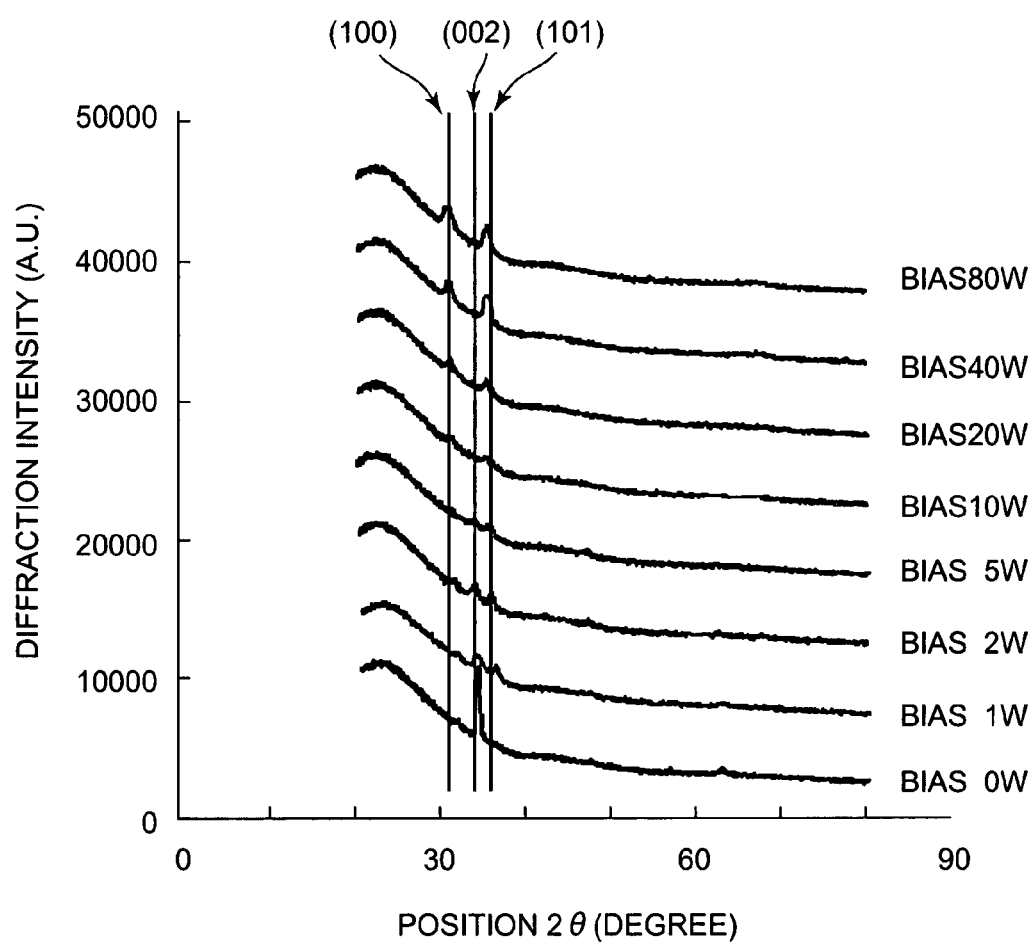
FIG. 3 shows the results of X-ray diffraction when 0 W, 1 W, 2 W, 5 W, 10 W, 20 W, 40 W, and 80 W of bias power were applied to the substrate during deposition of the oxide semiconductor thin film layer.

FIG. 3 shows the X-ray diffraction intensity as a function of different bias electric powers applied to the substrate during zinc oxide film formation of the oxide semiconductor thin film layer. Specifically, the oxide semiconductor thin film layer was formed with different bias electric powers of 0 W, 1 W, 2 W, 5 W, 10 W, 20 W, 40 W, and 80 W. In other words, the oxide semiconductor thin film layer was formed without applying bias electric power and with applying different bias electric powers ranging from about 0.5% to about 45% of the input electric power.

When no bias electric power was applied to the substrate during deposition of the oxide semiconductor thin film layer, no other orientation but (002) orientation was detected.

When 1 W of bias electric power was applied to the substrate during deposition of the oxide semiconductor thin film layer, (002) orientation was decreased and (101) orientation was observed. It is presumed that similar effect can be obtained by 1 W or less bias electric power although such minute bias electric power was not tested by the radio frequency power source used in the examples.

When 1 W to 10 W bias electric power was used, an oxide semiconductor thin film layer having the ratio I(002)/I(101)

of 2 or less was obtained. Since such an oxide semiconductor thin film layer had a smoother surface than a conventional oxide semiconductor thin film, the microfabrication property was improved. Also, the heat resistance of the oxide semiconductor thin film layer was improved.

When 10 W (i.e. 5% of the input electric power) or greater bias electric power was applied to the substrate during deposition of the oxide semiconductor thin film layer, orientation of the oxide semiconductor thin film layer changed to the (100) and (101) mixed orientation from the (002) and (101) mixed orientation. The ratio I(101)/I(100) ranged from 0.5 to 5. Such an oxide semiconductor thin film layer had higher heat resistance and an improved microfabrication property.

Figure 4A:
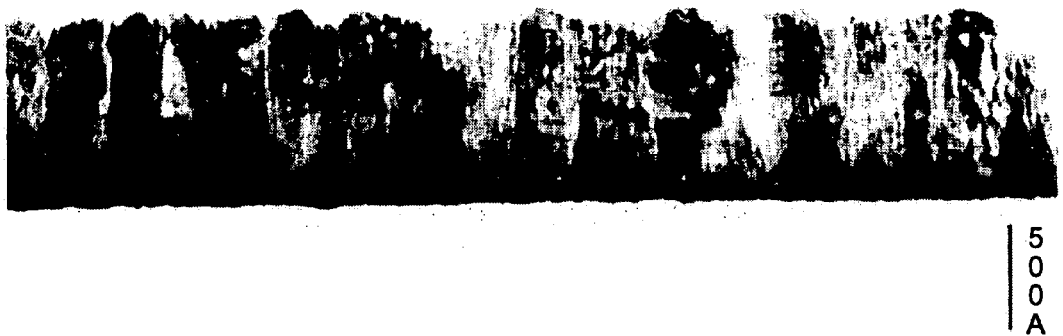
FIG. 4A is a photographic view showing a cross sectional TEM image of the oxide semiconductor thin film layer when 0 W of bias power (i.e., no bias power) was applied to the substrate during deposition of the oxide semiconductor thin film layer.
Figure 4B:
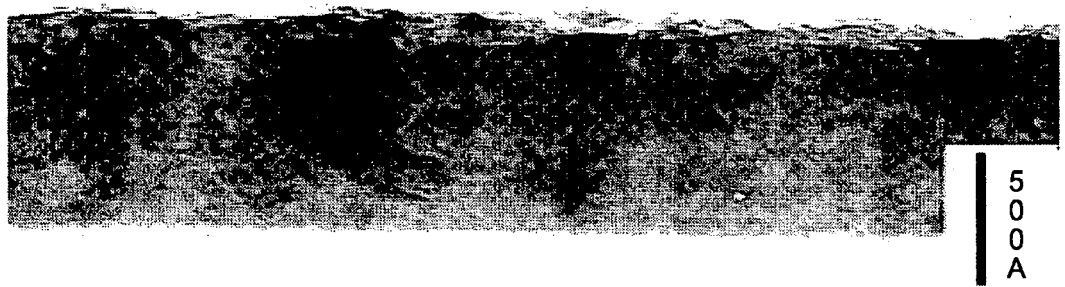
FIG. 4B is a photographic view showing a cross sectional TEM image of the oxide semiconductor thin film layer when 5 W of bias power was applied to the substrate during deposition of the oxide semiconductor thin film layer.

FIG. 4A shows a cross-sectional transmission electron microscopic (TEM) image of the oxide semiconductor thin film layer formed when 0 W bias electric power was applied to the substrate during deposition of the oxide semiconductor thin film layer and FIG. 4B shows a cross-sectional TEM image of the oxide semiconductor thin film layer formed when 5 W bias electric power was applied to the substrate during deposition of the oxide semiconductor thin film layer.

When 0 W bias electric power was applied (i.e. no bias electric power was applied) to the substrate during deposition of the oxide semiconductor thin film layer, columnar crystal structure and significant surface roughness were observed. The columnar structure was presumed to result from c-axis (002) orientation.

On the other hand, referring to the cross-sectional TEM image of the oxide semiconductor thin film layer formed when 5 W bias electric power was applied to the substrate during deposition of the oxide semiconductor thin film layer, it was observed that the oxide semiconductor thin film layer was micro-crystallized to have a smoother surface, although the oxide semiconductor thin film layer still had a preferred c-axis orientation. Using such an oxide semiconductor thin film layer with a smoother surface, it is possible to form thinner semiconductor devices such as TFTs. The resultant TFTs have enhanced current drive ability.

Figure 5A:
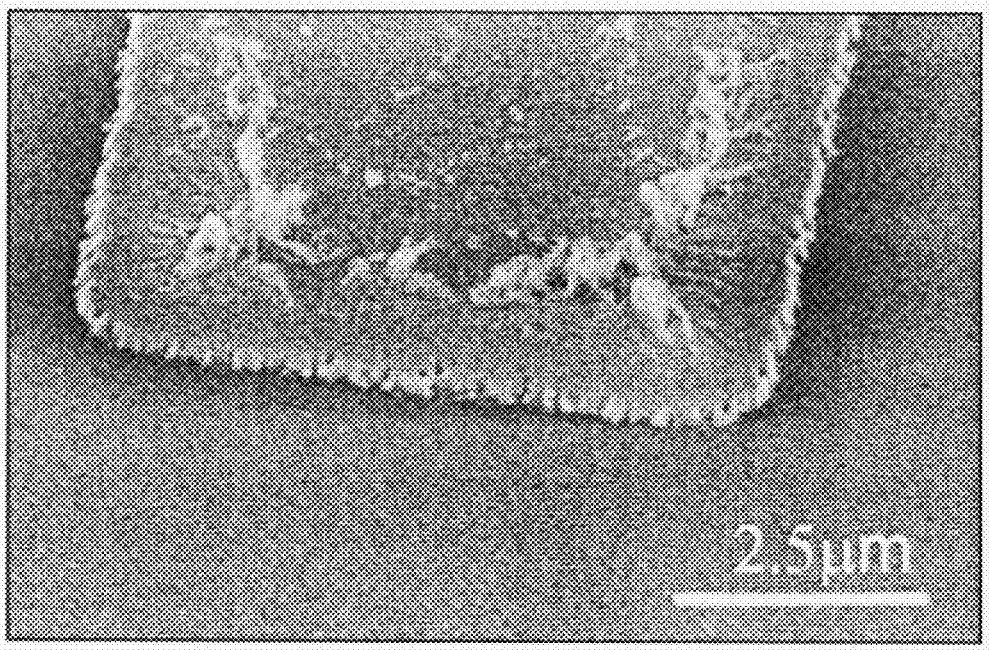
FIG. 5A is a photographic view showing a scanning electron microscope (SEM) image of the dry-etched side surface of the oxide semiconductor thin film layer when 0 W of bias power was applied to the substrate during deposition of the oxide semiconductor thin film layer.
Figure 5B:
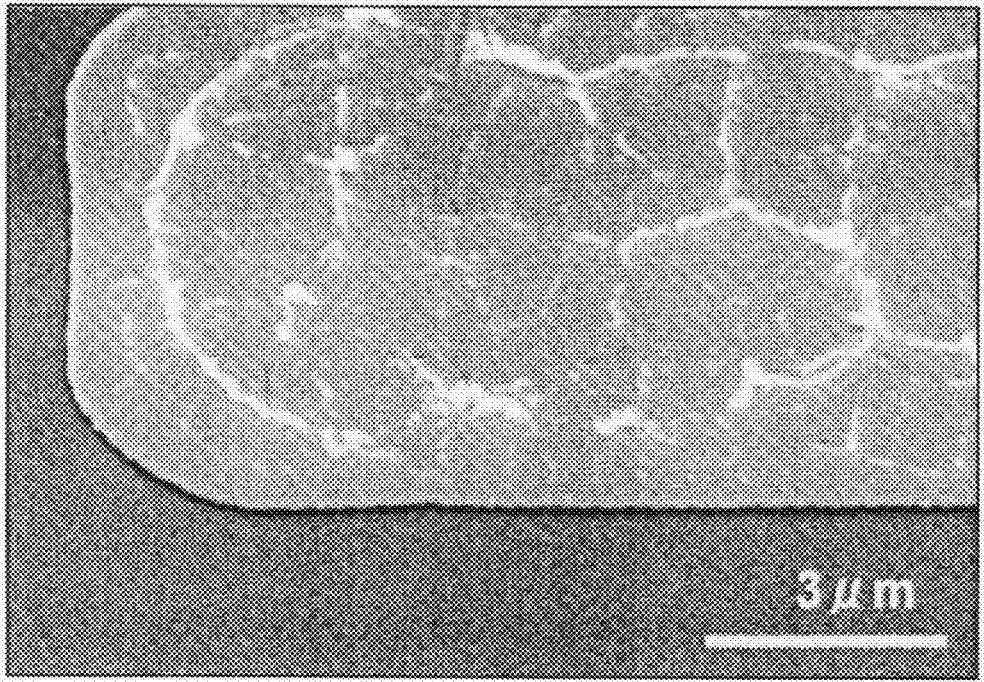
FIG. 5B is a photographic view showing a scanning electron microscope (SEM) image of the dry-etched side surface of the oxide semiconductor thin film layer when 40 W of bias power was applied to the substrate during deposition of the oxide semiconductor thin film layer.

FIG. 5A and FIG. 5B respectively show a scanning electron microscopic (SEM) image of a dry-etched oxide semiconductor (zinc oxide) thin film layer formed when 0 W and 40 W bias electric power was applied to the substrate during deposition of the oxide semiconductor thin film layer. $CH_4$ gas was used in the dry etching.

When 0 W bias electric power was applied (i.e. no bias electric power was applied) to the substrate during deposition of the oxide semiconductor thin film layer, patterned side surfaces of the dry-etched oxide semiconductor thin film layer were rougher because the oxide semiconductor thin film layer having a c-axis (002) orientation was etched along the columnar crystal structure of zinc oxide.

On the other hand, when 40 W bias electric power was applied to the substrate during deposition of the oxide semiconductor thin film layer, the columnar crystal structure collapsed and the patterned side surfaces formed smooth surfaces with less roughness. Thus the microfabrication property of the oxide semiconductor thin film layer was improved by applying an appropriate bias electric power.

Figure 6A:
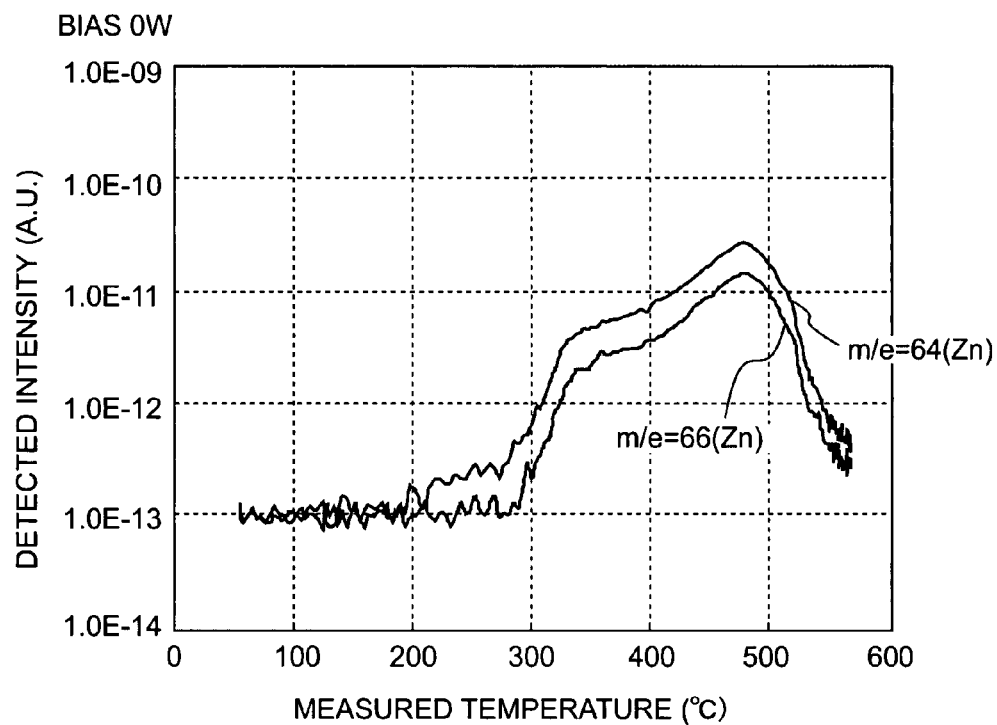
FIG. 6A is a view showing the measurement results of the amount of Zn with mass number (m/e) of 64 and 66 removed by a thermal desorption spectroscopy when 0 W of bias power was applied to the substrate during deposition of the oxide semiconductor thin film layer.
Figure 6B:
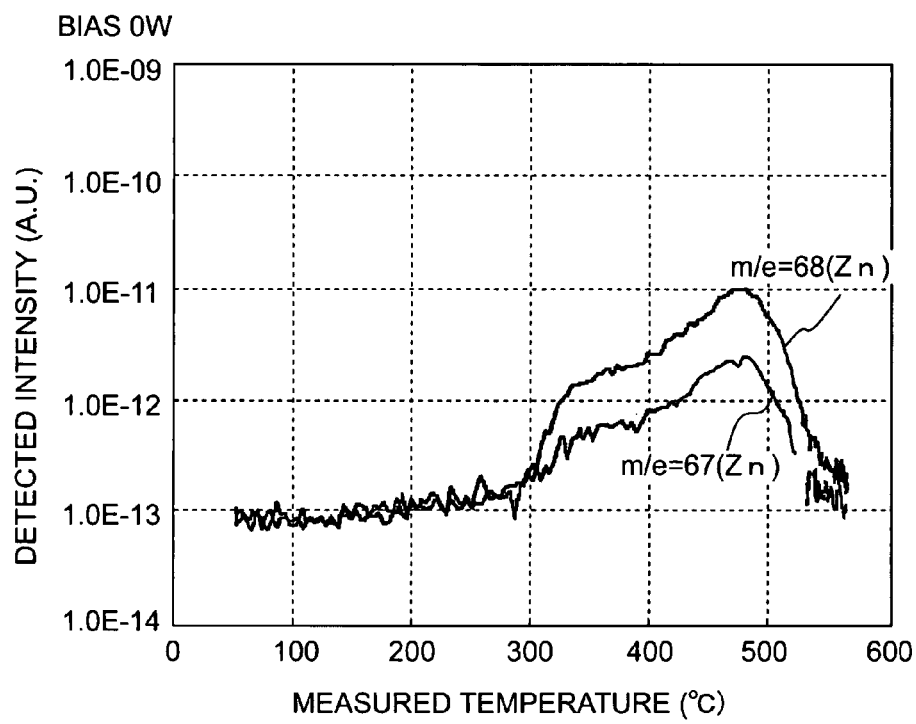
FIG. 6B is a view showing the measurement results of the amount of Zn with mass number (m/e) of 67 and 68 removed by a thermal desorption spectroscopy when 0 W of bias power was applied to the substrate during deposition of the oxide semiconductor thin film layer.
Figure 7A:
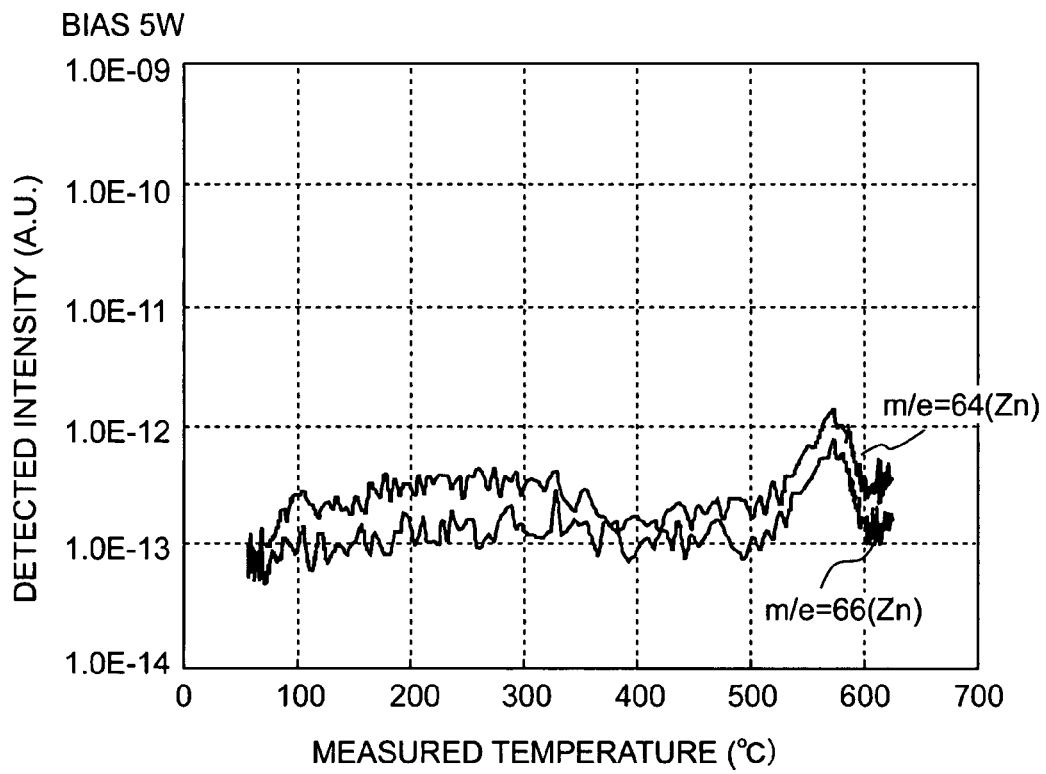
FIG. 7A is a view showing the measurement results of the amount of Zn with mass number (m/e) of 64 and 66 removed by a thermal desorption spectroscopy when 5 W of bias power was applied to the substrate during deposition of the oxide semiconductor thin film layer.
Figure 7B:
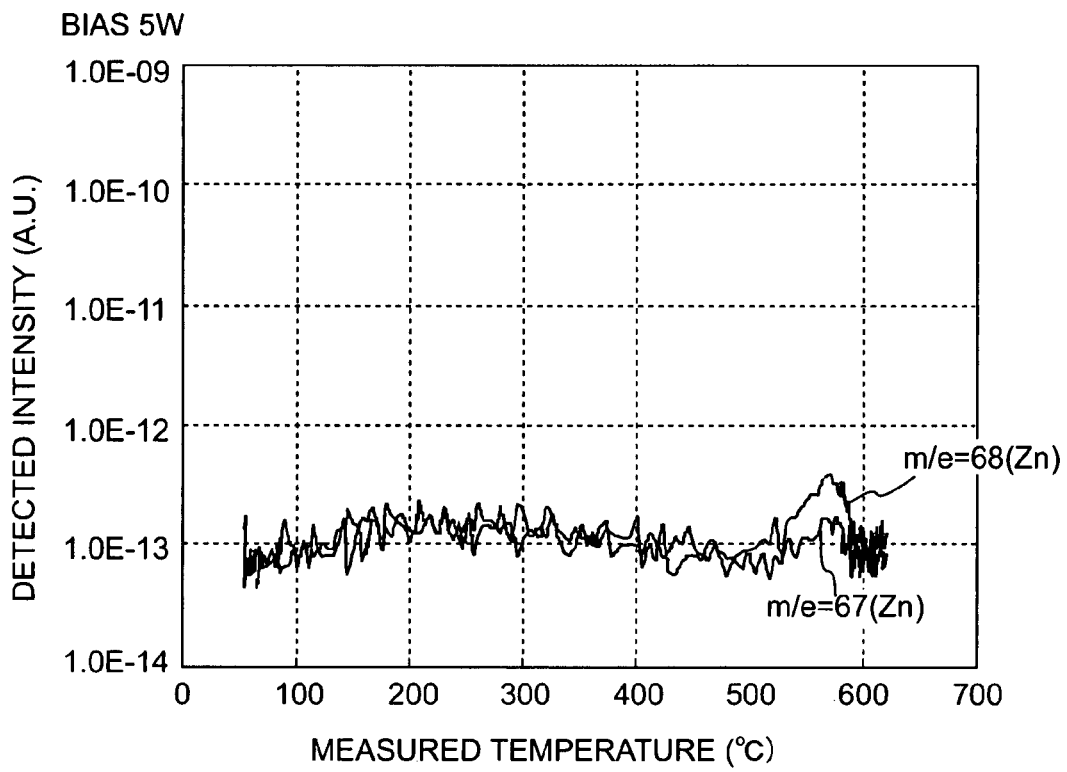
FIG. 7B is a view showing the measurement results of the amount of Zn with mass number (m/e) of 67 and 68 removed by a thermal desorption spectroscopy when 5 W of bias power was applied to the substrate during deposition of the oxide semiconductor thin film layer.

FIG. 6A and FIG. 6B show the thermal desorption spectra of the Zn desorption from zinc oxide contained in the oxide semiconductor thin film layer. The amount of the desorption of Zn was measured by using a thermal desorption method and an oxide semiconductor thin film layer formed when 0 W bias electric power was applied to the substrate during deposition of the oxide semiconductor thin film layer. FIG. 7A and FIG. 7B show the amount of the removed Zn in a similar measurement to the examples in FIGS. 6A and 6B, using an oxide semiconductor thin film layer formed with 5 W bias electric power applied to the substrate during deposition of the oxide semiconductor thin film layer. FIG. 6A and FIG. 7A show the amount of removed Zn with mass number (m/e) of 64 and 66 whereas FIG. 6B and FIG. 7B show the amount of removed Zn with mass number (m/e) of 67 and 68.

When 0 W bias electric power was applied (i.e. no bias electric power was applied) to the substrate during deposition of the oxide semiconductor thin film layer, desorption of Zn from zinc oxide started when the heat treatment temperature exceeded about 200 degrees C. and the amount of removed Zn rapidly increased when the heat treatment temperature exceeded about 300 degrees C. Such behavior resulted from thermal instability of the oxide semiconductor thin film layer having columnar structures and many crystal grain boundaries.

On the other hand, when 5 W bias electric power was applied to the substrate during deposition of the oside semiconductor thin film layer, the columnar crystal structures collapsed. A reduction in the amount of removed constituents of zinc oxide was achieved even at higher heat treatment temperatures. When a such oxide semiconductor thin film layer was used in a semiconductor device such as a TFT, desorption of zinc oxide constituents was prevented even when the TFT was heat treated during gate insulating film formation. Thus the decrease in the resistance of the oxide semiconductor thin film layer was prevented and leak current was suppressed.

As described above, the oxide semiconductor thin film layer of the semiconductor devices according to the present invention has higher heat resistance, a smoother surface, and an enhanced microfabrication property.

What is claimed is:

1. A manufacturing method of a semiconductor device comprising:
   forming an oxide semiconductor thin film layer primarily comprising zinc oxide on a substrate by sputtering by using an oxide target primarily comprising zinc oxide;
   wherein forming the oxide semiconductor thin film layer comprises applying a first radio frequency electric power to the oxide target and applying a second radio frequency electric power, which is different from the first radio frequency electric power, to the substrate in order to control an orientation of zinc oxide that is a constituent of the oxide semiconductor thin film layer to have at least one orientation other than (002) orientation.

2. The manufacturing method of a semiconductor device of claim 1, wherein applying the second radio frequency electric power to the substrate is performed via a substrate stage on which the substrate is mounted.

3. The manufacturing method of a semiconductor device of claim 1, wherein a frequency of the first radio frequency electric power is equal to a frequency of the second radio frequency electric power.

4. The manufacturing method of a semiconductor device of claim 1, wherein the sputtering is magnetron sputtering.

5. A manufacturing method of a semiconductor device comprising:
   preparing a target used in forming an oxide semiconductor of the semiconductor device;
   preparing a substrate; and
   forming the oxide semiconductor on the substrate by sputtering using the target;
   wherein forming the oxide semiconductor on the substrate comprises applying a first radio frequency electric power to the target and applying a second radio frequency electric power, which is in a range of 0.5% to 45% of the first radio frequency electric power, to the substrate.

6. The manufacturing method of a semiconductor device of claim 5, wherein the target contains zinc oxide, and the second radio frequency electric power is applied such that zinc oxide contained in the oxide semiconductor formed on the substrate has at least one orientation other than (002) orientation.

7. The manufacturing method of a semiconductor device of claim 6, wherein the second radio frequency electric power is applied such that the zinc oxide contained in the oxide semiconductor formed on the substrate has a mixed orientation including (002) orientation and (101) orientation.

8. The manufacturing method of a semiconductor device of claim 6, wherein the second radio frequency electric power is applied such that the zinc oxide contained in the oxide semiconductor formed on the substrate has a mixed orientation including (100) orientation and (101) orientation.

9. The manufacturing method of a semiconductor device of claim 5, wherein a frequency of the first radio frequency electric power is equal to a frequency of the second radio frequency electric power.

10. The manufacturing method of a semiconductor device of claim 5, wherein the sputtering is magnetron sputtering.

11. A manufacturing method of a semiconductor device comprising:
preparing a target containing zinc oxide used in forming an oxide semiconductor of the semiconductor device;
preparing a substrate; and
forming the oxide semiconductor on the substrate by sputtering using the target;
wherein forming the oxide semiconductor on the substrate comprises applying a first radio frequency electric power to the target and applying a second radio frequency electric power, which is smaller than the first radio frequency electric power, to the substrate; and
wherein the second radio frequency electric power is applied such that zinc oxide contained in the oxide semiconductor formed on the substrate has a mixed orientation including (002) orientation and (001) orientation, and a ratio I(002)/I(101) between X-ray diffraction intensity I(002) indicating the (002) orientation of the zinc oxide contained in the oxide semiconductor formed on the substrate and X-ray diffraction intensity I(101) indicating the (101) orientation of the zinc oxide contained in the oxide semiconductor formed on the substrate is not more than 2.

12. A manufacturing method of a semiconductor device comprising:
preparing a target containing zinc oxide used in forming an oxide semiconductor of the semiconductor device;
preparing a substrate; and
forming the oxide semiconductor on the substrate by sputtering using the target;
wherein forming the oxide semiconductor on the substrate comprises applying a first radio frequency electric power to the target and applying a second radio frequency electric power, which is smaller than the first radio frequency electric power, to the substrate; and
wherein the second radio frequency electric power is applied such that zinc oxide contained in the oxide semiconductor formed on the substrate has a mixed orientation including (100) orientation and (101) orientation, and a ratio I(101)/I(100) between X-ray diffraction intensity I(101) indicating the (101) orientation of the zinc oxide contained in the oxide semiconductor formed on the substrate and X-ray diffraction intensity I(100) indicating the (100) orientation of the zinc oxide contained in the oxide semiconductor formed on the substrate is in a range of 0.5 to 5.

* * * * *